US 6,631,693 B2

(12) United States Patent
Hilliker

(10) Patent No.: US 6,631,693 B2
(45) Date of Patent: Oct. 14, 2003

(54) ABSORPTIVE FILTER FOR SEMICONDUCTOR PROCESSING SYSTEMS

(75) Inventor: Stephen E. Hilliker, Bonita, CA (US)

(73) Assignee: Novellus Systems, Inc., San Jose, CA (US)

( * ) Notice: Subject to any disclaimer, the term of this patent is extended or adjusted under 35 U.S.C. 154(b) by 66 days.

(21) Appl. No.: 09/774,446

(22) Filed: Jan. 30, 2001

(65) Prior Publication Data

US 2002/0100422 A1 Aug. 1, 2002

(51) Int. Cl.$^7$ .................. C23C 16/00; C23C 14/00; H05H 1/00; H01J 1/00
(52) U.S. Cl. .................. 118/723 E; 118/723 I; 156/345.44; 156/345.47; 156/345.43; 156/345.48; 315/111.21; 315/111.51; 204/298.08
(58) Field of Search .................. 118/723 E, 723 ER, 118/723 I, 723 IR, 723 MW, 723 AN, 723 R, 715; 156/345.43, 345.44, 345.45, 345.46, 345.47, 345.48, 345.49; 315/111.21, 111.51, 111.31, 111.71; 204/298.08

(56) References Cited

U.S. PATENT DOCUMENTS

| 4,824,546 A | * | 4/1989 | Ohmi et al. | 204/298.08 |
| 5,110,438 A | * | 5/1992 | Ohmi et al. | 204/298.34 |
| RE34,106 E | * | 10/1992 | Ohmi et al. | 204/298.08 |
| 5,187,457 A | * | 2/1993 | Chawla et al. | 333/170 |
| 5,653,811 A | * | 8/1997 | Chan | 118/723 I |
| 5,660,694 A | * | 8/1997 | Ohmi et al. | 204/192.12 |
| 5,747,935 A | * | 5/1998 | Porter et al. | 315/111.51 |
| 5,849,136 A | * | 12/1998 | Mintz et al. | 156/345.44 |
| 6,046,546 A | * | 4/2000 | Porter et al. | 315/111.21 |

FOREIGN PATENT DOCUMENTS

| JP | 62-136112 A | * | 6/1987 | H03D/7/12 |
| JP | 62-171233 A | * | 7/1987 | H04B/1/10 |
| JP | 63-92106 A | * | 4/1988 | H03F/3/189 |
| JP | 3-165110 A | * | 7/1991 | H03H/7/46 |
| JP | 8-204472 A | * | 8/1996 | H03F/3/60 |

* cited by examiner

Primary Examiner—Parviz Hassanzadeh
(74) Attorney, Agent, or Firm—Okamoto & Benedicto LLP

(57) ABSTRACT

In one embodiment, an absorptive filter network is provided between an RF generator and a semiconductor processing reactor. The absorptive filter network includes an absorptive filter circuit which allows energies at a fundamental frequency to pass while absorbing energies at frequencies away from the fundamental frequency. An absorptive filter circuit is located on the reactor-side of the absorptive filter network to isolate the RF generator from the effects of the non-linear loading presented by a plasma in the reactor. Another absorptive filter circuit is located on the RF generator-side of the absorptive filter network to present a stable voltage waveform to the plasma.

12 Claims, 7 Drawing Sheets

ABSORPTIVE FILTER FOR SEMICONDUCTOR PROCESSING SYSTEMS

BACKGROUND OF THE INVENTION

1. Field of the Invention

This invention relates generally to semiconductor processing systems, and more particularly to radio frequency (RF) power generation and distribution.

2. Description of the Background Art

Semiconductor processing systems are used in the fabrication of semiconductor devices. In a semiconductor processing system that employs a plasma, such as a plasma enhanced chemical vapor deposition (PECVD) system, radio frequency (RF) power is supplied to the system's reactor to maintain a plasma therein. A semiconductor substrate in the reactor is exposed to the plasma and process gases, thereby performing a fabrication process on the substrate. In a PECVD system, for example, the fabrication process may be deposition of a thin film of dielectric material on the substrate.

As the integration and complexity of semiconductor devices increase, so does the sensitivity of fabrication processes to the supplied RF power. This results in undesired process changes, commonly referred to as process shifts, when the RF generator supplying the RF power is changed or when the level of the RF power is unstable. In some cases, a process shift occurs even when the RF generator is replaced with another of the same make and model. Because process shifts result in unreliable or defective devices, a technique for stabilizing the RF power generated by the RF generator and seen by the plasma is desirable.

SUMMARY

The present invention relates to a method and apparatus for stabilizing the radio frequency (RF) power used in semiconductor device processing. The invention is suitable for use in a variety of semiconductor processing systems including those used for chemical vapor deposition, physical vapor deposition, and etching.

In one embodiment, an absorptive filter network is provided between an RF generator and a semiconductor processing reactor. The absorptive filter network includes an absorptive filter circuit which allows energies at a fundamental frequency to pass while absorbing energies at frequencies away from the fundamental frequency. An absorptive filter circuit is located on a node facing the reactor to isolate the RF generator from the effects of the non-linear loading presented by a plasma in the reactor. Another absorptive filter circuit is located on a node facing the RF generator to present a stable voltage waveform to the plasma. The absorptive filter network minimizes variations in the supplied RF power, and helps prevent fabrication processes from shifting.

In one embodiment, an absorptive filter circuit includes a resistive element and a parallel resonant circuit that resonates at the fundamental frequency. At the fundamental frequency, the parallel resonant circuit appears as a high impedance path to ground and does not affect the RF power. At frequencies away from the fundamental frequency, the parallel resonant circuit shunts energies to the resistive element, which dissipates the energies. By dissipating unwanted energies instead of merely rejecting them, the chance of RF power variations causing a process shift is greatly diminished.

In another embodiment, the absorptive filter circuit also includes a parallel-series resonant circuit for rejecting residual energies at frequencies that are away from the fundamental frequency.

The above described embodiments are suitable for use in applications where the supplied RF power has a single, fixed frequency. For applications requiring variable frequency RF power, a filter network having a dissipating circuit is used to minimize RF power variations. The dissipating circuit includes a high-pass filter and a resistive element. The high-pass filter is set at a cut-off frequency above the frequencies of interest. Energies at frequencies below the cut-off frequency (i.e., the frequency range of the supplied RF power) are allowed to pass, while energies at frequencies above the cut-off frequency are shunted to the resistive element, where the energies are dissipated. A low-pass filter in series with the RF generator and the reactor is also provided to reject residual energies at frequencies away from the cut-off frequency. The aforementioned filter network with a dissipating circuit may also be used in fixed frequency applications.

These and other features, embodiments, and advantages of the present invention will be readily apparent to persons of ordinary skill in the art upon reading the entirety of this disclosure, which includes the accompanying drawings and claims.

The use of the same reference labels in different drawings indicates the same or like components.

DETAILED DESCRIPTION

Figure 1:
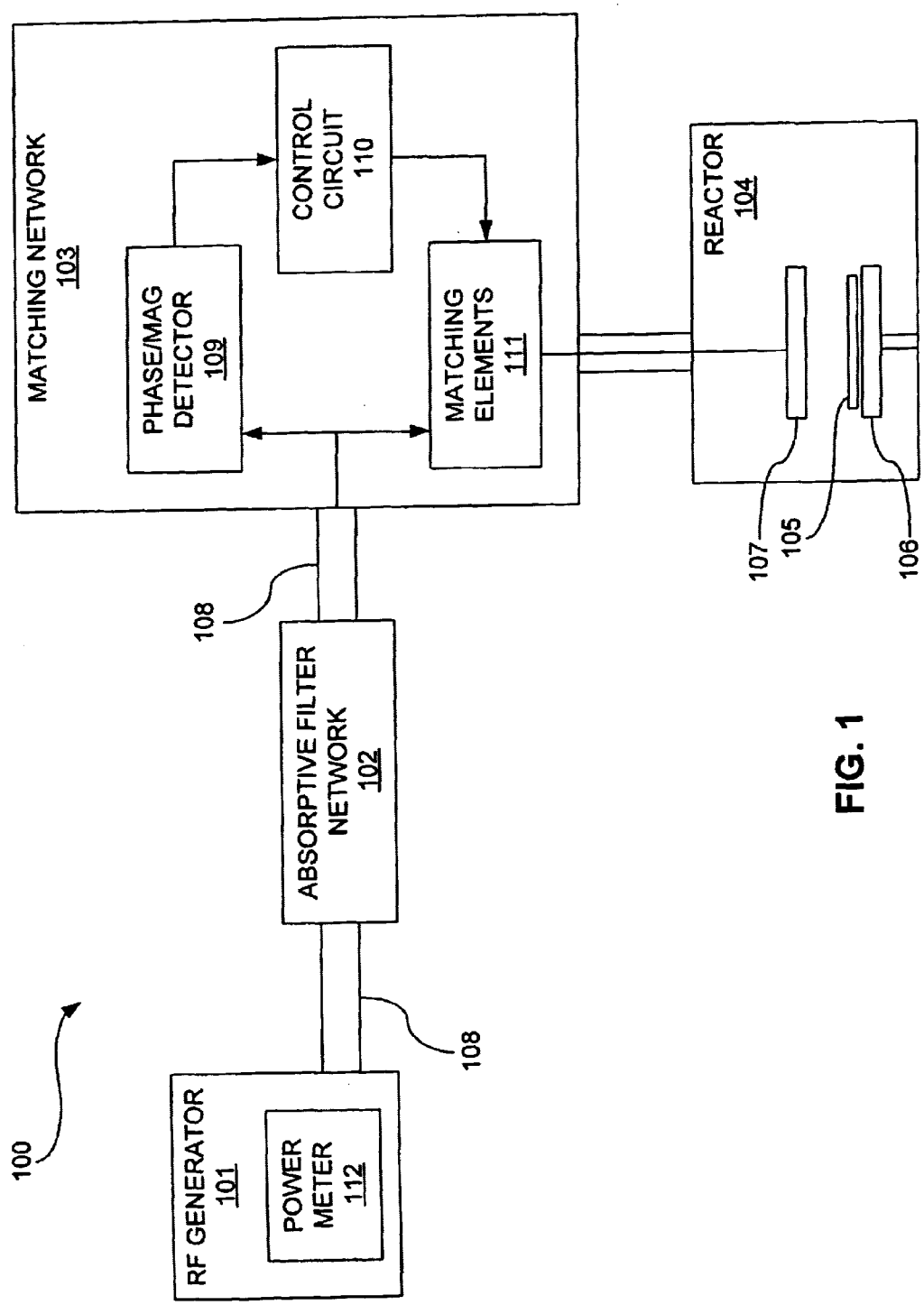
FIG. 1 shows a block diagram of a semiconductor processing system in accordance with an embodiment of the present invention.

Turning now to FIG. 1, there is shown a block diagram of a semiconductor processing system 100 in accordance with an embodiment of the present invention. Semiconductor processing system 100 includes a radio frequency (RF) generator 101, an absorptive filter network 102, a matching network 103, and a reactor 104. Well known components that are not necessary to the understanding of the invention, such as load locks and transfer chambers, have been omitted in FIG. 1 for clarity of illustration.

Reactor 104 may be any conventional reactor used for semiconductor processing. For example, reactor 104 may be a chemical vapor deposition (CVD), physical vapor deposition (PVD), or reactive ion etching reactor. In reactor 104, a plasma is generated between a bottom electrode 106 and a top electrode 107. Bottom electrode 106 may be a pedestal for supporting a semiconductor substrate 105, while top electrode 107 may be a shower head for introducing process gases into reactor 104. Plasma is ignited and maintained in reactor 104 by supplying RF power to top electrode 107. (Of course, the RF power has a return path to ground.)

A matching network 103 matches the impedance of reactor 104 to the characteristic impedance of a transmission line 108 to prevent reflections from being transmitted back to RF generator 101. In the semiconductor industry, transmission line 108 is typically a 50 Ω coaxial cable. Thus, matching network 103 makes the reactor appear as a 50 Ω load to RF generator 101. Matching network 103 includes a phase/magnitude detector 109, a control circuit 110, and matching elements 111. Detector 109 measures the phase and magnitude of the RF power received from RF generator 101 via transmission line 108. The phase/magnitude measurement is provided to a control circuit 110, which varies the component values of matching elements 111 so that reactor 104 continues to appear as a 50 Ω load. As is apparent to a person of ordinary skill in the art reading the present disclosure, matching elements 111 may include a network of inductors and variable capacitors. In that case, control circuit 110 varies the values of matching capacitors in matching elements 111 in response to the phase/magnitude information provided by detector 109. Matching network 103 may also be any of the impedance matching networks commercially available for use in semiconductor processing systems.

RF generator 101 supplies RF power to reactor 104 through matching network 103. RF generator 101 may be of the type generally used in the semiconductor industry including those available from ENI Technology, Inc. and Advanced Energy Industries, Inc. A power meter 112 in RF generator 101 measures the level of the supplied RF power which, in one embodiment, has a fundamental frequency of 13.56 MHZ.

To supply the correct amount of RF power to reactor 104, an absorptive filter network 102 isolates RF generator 101 from the load presented by the plasma. Even with matching network 103 in place, the plasma in reactor 104 presents a non-linear load which could cause power meter 112 to make inaccurate readings. Without absorptive filter network 102, a power-delivery control loop in RF generator 101 could be confused by the inaccurate reading, resulting in the wrong amount of RF power to be generated. As will be further discussed below, absorptive filter network 102 isolates RF generator 101 by absorbing harmonic energies coming from the plasma.

Absorptive filter network 102 also stabilizes the voltage waveform seen by the plasma in reactor 104. The voltage waveform seen by the plasma is the sum of the fundamental voltage and harmonic voltages generated by RF generator 101, and the circulating harmonic voltages from the plasma. Thus, harmonic voltages could vary the waveform of the fundamental voltage. As will be further discussed below, absorptive filter network 102 stabilizes the voltage waveform seen by the plasma by absorbing harmonic energies coming from RF generator 101 while allowing energies at the fundamental frequency to pass through. This results in a stable voltage waveform that is not heavily affected by different RF configurations such as coaxial cable length changes and RF generator replacements (e.g., for maintenance).

Figure 2:
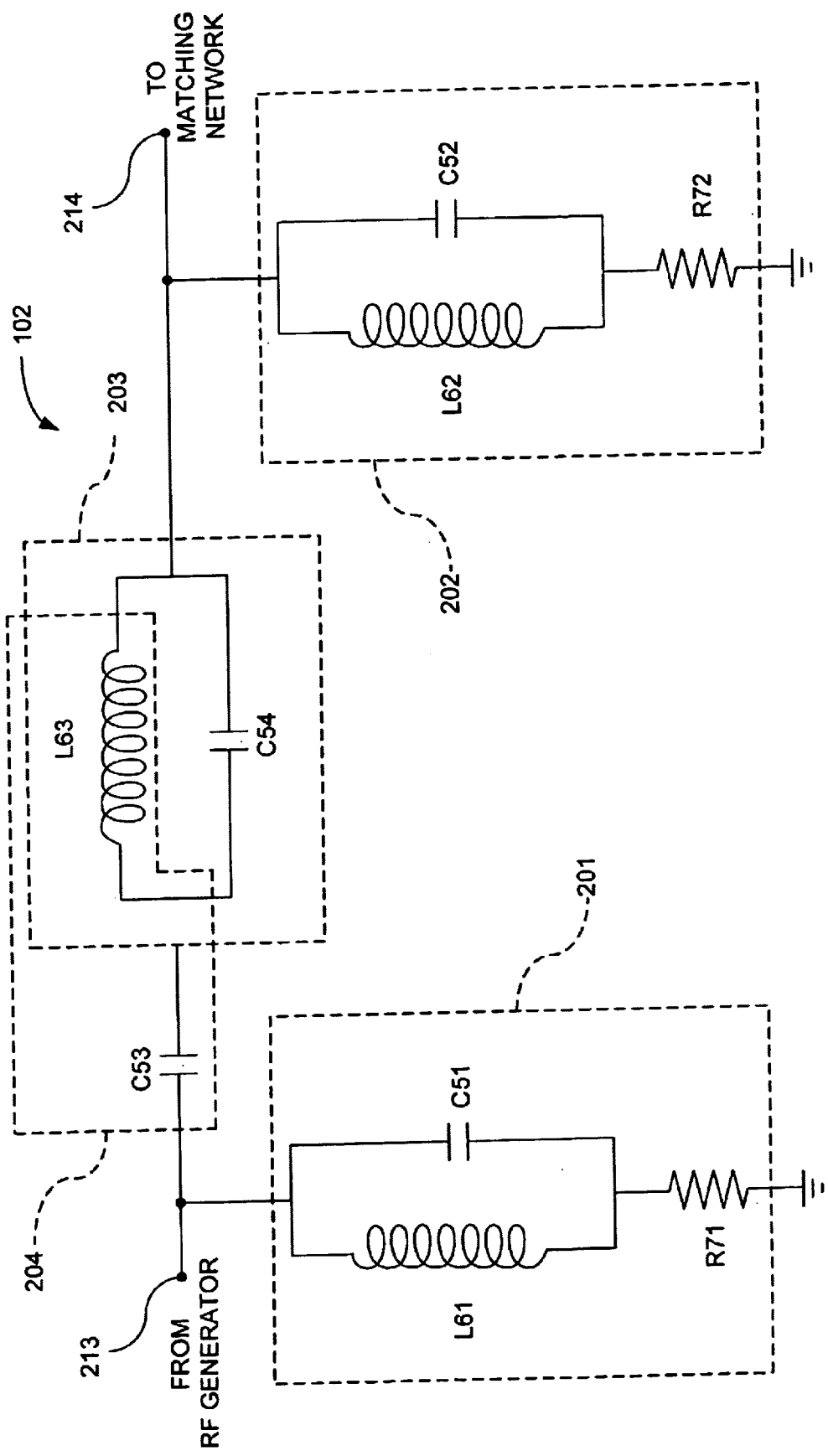
FIG. 2 shows a schematic diagram of an absorptive filter network in accordance with an embodiment of the present invention.

FIG. 2 shows a schematic diagram of an absorptive filter network 102 in accordance with an embodiment of the present invention. Absorptive filter network 102 is suitable for use in fabrication processes requiring fixed-frequency RF power. In absorptive filter network 102, an absorptive filter circuit 201 composed of inductor L61, capacitor C51, and resistor R71 allow energies at the fundamental frequency to pass through, while absorbing energies at harmonic and other frequencies. In the present embodiment, this is accomplished by selecting values for inductor L61 and capacitor C51 such that they form a parallel resonant circuit at the fundamental frequency. At resonance, inductor L61 and capacitor C51 appear as an open circuit to RF generator 101 and therefore allow energy at the fundamental frequency to be delivered to the plasma. At frequencies away from the fundamental frequency (e.g., at harmonic frequencies), however, inductor L61 and capacitor C51 provide a low impedance path from node 213 to a resistor R71, which may be a power resistor. Thus, energies at harmonic frequencies are dissipated by resistor R71 instead of being delivered to the plasma. In the embodiment where RF generator 101 supplies a 13.56 MHZ RF power, inductor L61 and capacitor C51 are designed to resonate at the fundamental frequency of 13.56 MHZ. Energies at the harmonics of 13.56 MHZ are dissipated in resistor R71. Resistor R71 is a 50 Ω power resistor in embodiments where absorptive filter network 102 is located along a 50 Ω coaxial cable between the RF generator and the matching network.

Unlike a band pass filter, absorptive filter circuit 201 absorbs, rather than rejects, energies at frequencies away from resonance (which in this disclosure is the fundamental frequency). By absorbing unwanted energies instead of merely rejecting them, the likelihood of the unwanted energies circulating in the semiconductor processing system and causing a process shift is greatly diminished. Absorbing the unwanted energies prevents them from being added (at a node between RF generator 101 and reactor 104) back to the voltage waveform seen by the plasma.

Whereas absorptive filter circuit 201 absorbs harmonic energies coming from the RF generator, an absorptive filter circuit 202 composed of inductor L62, capacitor C52, and resistor R72 absorbs harmonic energies coming from the plasma. Absorptive filter circuit 202 thus prevents power meter 112 (FIG. 1) from making inaccurate power readings, and accordingly allows RF generator 101 to provide a stable and correct amount of RF power. The values of inductor L62 and capacitor C52 are chosen such that they form a parallel resonant circuit at the fundamental frequency. At resonance, inductor L62 and capacitor C52 appear as an open circuit and accordingly does not influence the plasma. At frequencies away from resonance, inductor L62 and capacitor C52 provide a low impedance path from node 214 to resistor R72, which may be a 50 Ω power resistor. Energies at frequencies away from resonance are dissipated by resistor R72 and prevented from reaching RF generator 101.

In absorptive filter network 102, inductor L63 and capacitor C54 form a parallel resonant circuit 203 at a frequency between the second and third harmonics of the fundamental frequency. Capacitor C53 and the effective inductance of parallel resonant circuit 203 form a series resonant circuit at the fundamental frequency. This results in energies at the fundamental frequency to pass from node 213 to node 214 and vice versa. Energies away from the fundamental frequency, however, are rejected. The parallel-series resonant circuit of inductor L63, capacitor C54, and capacitor C53 rejects residual unwanted energies that have not been dissipated by the absorptive filter circuits.

In the present embodiment, selecting the values of inductor L63 and capacitor C54 such that they resonate at a frequency between the second and third harmonics results in better rejection of energies at the other harmonic frequencies. To suit specific applications, a person of ordinary skill in the art may experiment with different values of inductor L63 and capacitor C54 to get a parallel resonant frequency that results in optimum rejection of harmonic energies.

Another way of analyzing the parallel-series resonant circuit is to view capacitor C53 as forming a series resonant circuit 204 with inductor L63 to block unwanted energies from passing through absorptive filter network 102. As can be appreciated by a person of ordinary skill in the art reading the present disclosure, capacitor C54 increases the effective inductance of parallel resonant circuit 203 at frequencies above the fundamental to allow optimum rejection of selected harmonic energies.

Referring to FIG. 1, absorptive filter network 102 may be located anywhere between RF generator 101 and reactor 104. Placing absorptive filter network 102 just outside matching network 103 as shown in FIG. 1 allows pre-existing semiconductor processing systems to be retrofitted and also has the additional benefit of being able to select multiple vendors for matching network 103 (because the absorptive filter network is outside the matching network). Of course, the input impedance and output impedance of the absorptive filter network (e.g., resistors R71 and R72 in absorptive filter network 102) should match the characteristic impedance of the transmission line employed to prevent reflections.

Absorptive filter network 102 may also be located inside RF generator 101 or inside matching network 103. When inside matching network 103, absorptive filter network 102 may be located between phase/magnitude detector 109 and matching elements 111. This prevents phase/magnitude detector 109 from being affected by harmonic energies from the plasma, resulting in better control of matching elements 111.

Although absorptive filter network 102 may also be located in front of matching elements 111 (e.g., just outside reactor 104), this results in additional complexity because absorptive filter network 102 will be directly exposed to the non-linear load presented by the plasma. Accordingly, the components of absorptive filter network 102 will require a higher volt-amp rating to withstand energies coming from the plasma. For simplicity, absorptive filter network 102 is advantageously located behind matching elements 111. However, the added cost and complexity of placing the absorptive filter network in front of matching elements 111 may be justifiable in some applications.

As can be appreciated, a single absorptive filter circuit may be used in some applications. For example, only absorptive filter circuit 202 (and not absorptive filter circuit 201) is required where the harmonic energies generated by the RF generator is minimal. Similarly, only absorptive filter circuit 201 (and not absorptive filter circuit 202) is required where the plasma does not emanate significant amounts of harmonic energies.

Figure 3:
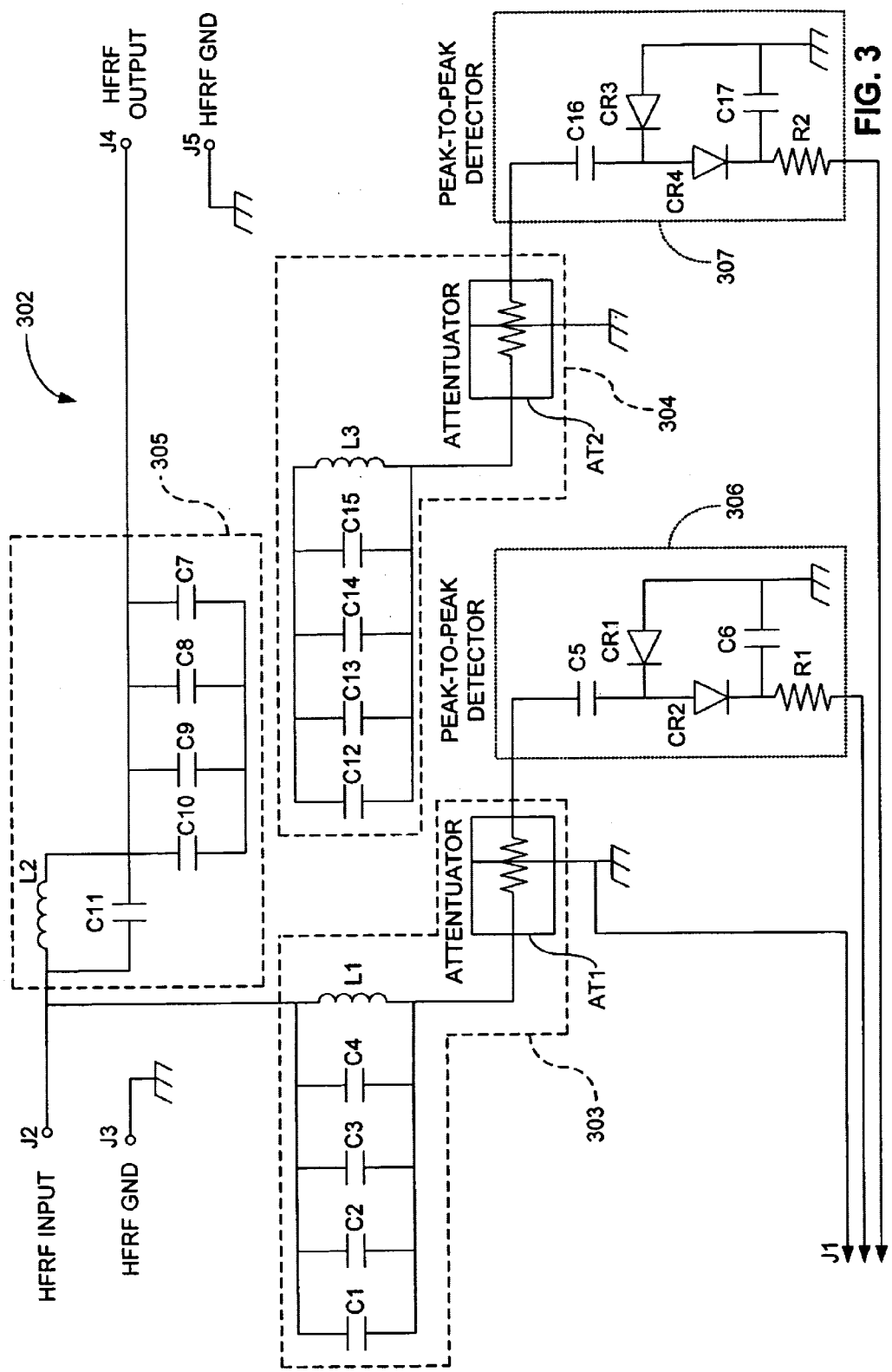
FIG. 3 shows a schematic diagram of an absorptive filter network in accordance with another embodiment of the present invention.

FIG. 3 shows a schematic diagram of an absorptive filter network 302 in accordance with another embodiment of the present invention. Generally speaking, absorptive filter networks 302 and 102 are similar in operation. In absorptive filter network 302, an absorptive filter circuit 303 absorbs harmonic energies produced by the RF generator, while an absorptive filter circuit 304 absorbs harmonic energies coming from the plasma. A parallel-series resonant circuit 305 between the absorptive filter circuits rejects any residual harmonic energies in the same manner as parallel resonant circuit 203 and capacitor C53 (see FIG. 2) of absorptive filter network 102. Energies at the fundamental frequency, which is 13.56 MHZ in this particular case, pass through absorptive filter network 302 with very minimum attenuation.

As shown in FIG. 3, absorptive filter circuit 303 includes an inductor L1, attenuator AT1, and capacitors C1, C2, C3 and C4. Inductor L1 and capacitors C1–C4 form a parallel resonant circuit at a resonant frequency of 13.56 MHZ. Instead of using a single large capacitor, several 68 pF capacitors are configured in parallel to minimize printed circuit board space and to take advantage of high-performance ceramic capacitors. In the present embodiment, capacitors C1–C4 are 68 pF, 3600V capacitors of the same type as the model ATC 100 E-series from American Technical Ceramics of Huntington Station, N.Y.

Figure 4:
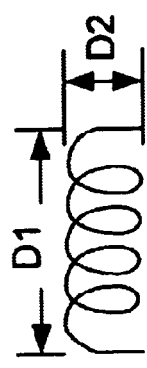
FIG. 4 illustrates the dimensions of an inductor suitable for use in the filters of the present invention.

In the present embodiment, inductor L1 has an inductance of 0.48 $\mu$H. FIG. 4 illustrates how to make an inductor L1 using a lacquer-coated copper inductor wire that has an outside diameter of 0.06 inch. In FIG. 4, an inductance of 0.48 $\mu$H is obtained by winding the copper wire six times (i.e., six turns), at an inside diameter D2 of approximately 0.725 inch, and at a length D1 of approximately 0.55 inch. Inductor L1 has no core (i.e., air wound). An inductance meter is used to verify and adjust the inductance of inductor L1.

Referring to FIG. 3, attenuator AT1 dissipates energies at frequencies away from the fundamental in the same manner as resistor R71 (see FIG. 2) of absorptive filter network 102. In the present embodiment, attenuator AT1 is a 50 $\Omega$, 30 db, 100W attenuator of the same type as the model RFP series from RF Power Components, Inc. of Bohemia, N.Y. Unlike a power resistor, attenuator AT1 dissipates most but not all of the energies across it so that the amount of harmonic energies coming from the RF generator at connectors J2/J3 can be monitored. One leg of attenuator AT1 is connected to a peak-to-peak detector 306, which is coupled to a data acquisition system (not shown) via a connector J1. The data acquisition system monitors the harmonic content of the supplied RF power to determine if the RF generator is malfunctioning. For example, if peak-to-peak detector 306 outputs a voltage that is higher than normal, that indicates a possible problem with the RF generator.

In this particular embodiment, the components of absorptive filter circuit 304 and absorptive filter circuit 303 have the same values and are of the same type. That is, capacitors C1–C4 are the same as capacitors C12–C15, inductor L1 is the same as inductor L3, and attenuator AT1 is the same as attenuator AT2. In absorptive filter circuit 304, inductor L3 and capacitors C12–C15 form a parallel resonant circuit at a resonant frequency of 13.56 MHZ. Most of the energies at frequencies away from 13.56 MHZ are dissipated by attenuator AT2. Energies not dissipated by attenuator AT2 are provided to a peak-to-peak detector 306 so that the harmonic energies coming from the plasma at connectors J4/J5 can be monitored by the data acquisition system (not shown) coupled to connector J1. For example, if peak-to-peak detector 306 outputs a voltage that is higher than normal, that indicates something has changed in the fabrication process.

Parallel-series resonant circuit 305 of absorptive filter network 302 includes an inductor L2 and a capacitor C11 which form a parallel resonant circuit at a frequency between the second and third harmonics of 13.56 MHZ (i.e., between 27.12 MHZ and 40.68 MHZ). An inductor L2 having an inductance of 0.75 μH and capacitor C11 having a capacitance of 22 pF (e.g., a 22 pF, 3600V ATC 100 E-series capacitor from American Technical Ceramics) result in a resonant frequency of 39.2 MHZ. The total capacitance of capacitors C7–C10 and the effective inductance of inductor L2 and capacitor C11 form a series resonant circuit at a resonant frequency of 13.56 MHZ. In the present embodiment, capacitors C7–C10 are 39 pF, 3600V ceramic capacitors of the same type as the AT 100 E-series capacitors from American Technical Ceramics. Referring to FIG. 4, inductor L2 is made by winding (no core) a 0.06 inch diameter lacquer-coated copper inductor wire seven times (i.e., seven turns), at an inside diameter D2 of approximately 0.725 inch, and at a length D1 of 0.65 inch. An inductance meter is used to verify and adjust the inductance of inductor L2, which is 0.75 μH in the present embodiment.

In parallel-series resonant circuit 305 shown in FIG. 3, the parallel resonant circuit composed of inductor L2 and capacitor C11 is closer to the RF generator than capacitors C7–10. In some applications, placing inductor L2 and capacitor C11 after capacitors C7–C10 may provide a measurable performance increase by minimizing the amount of stray capacitance (from the effective inductance of inductor L2 and capacitor C11) in front of the RF generator.

Figure 5A:
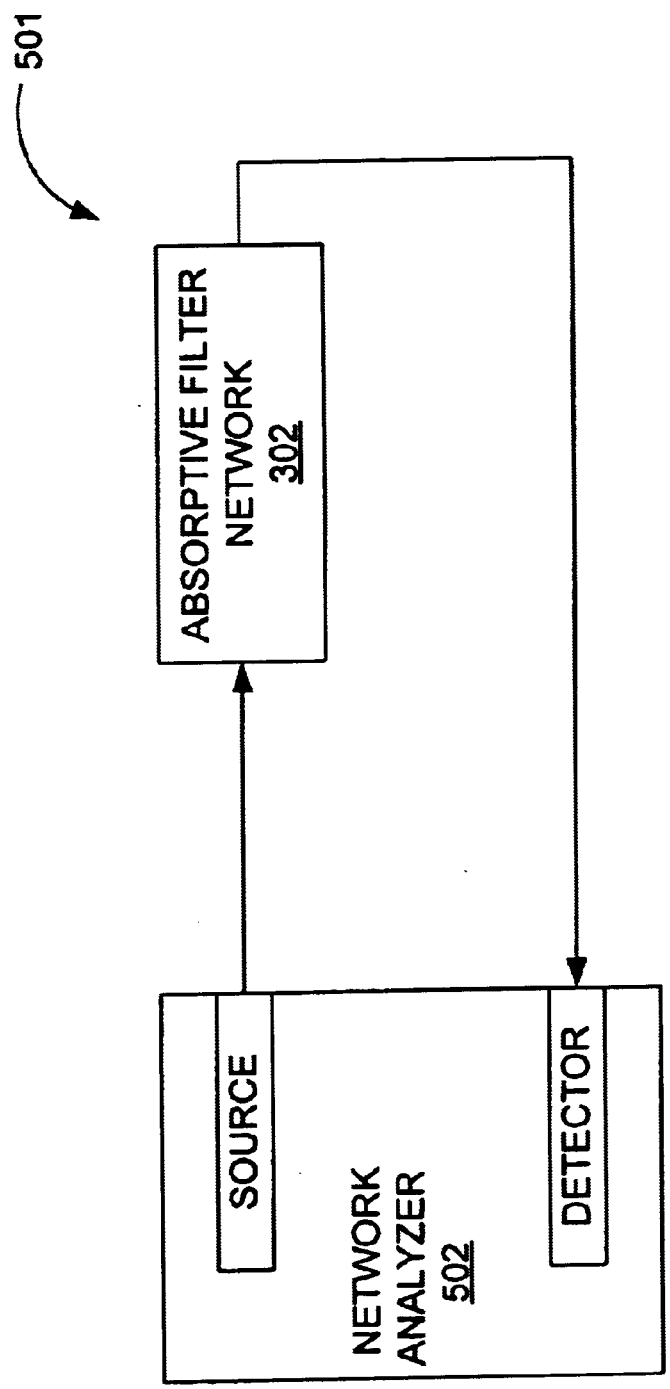
FIG. 5A shows a block diagram of a test configuration for analyzing the performance of an absorptive filter network in accordance with an embodiment of the present invention.

FIG. 5A shows a block diagram of a test configuration 501 for analyzing the performance of an absorptive filter network. In test configuration 501, absorptive filter network 302 is hooked up to a network analyzer 502, which may be of the same type as the model HP8712C network analyzer from the Hewlett-Packard Company (now Agilent Technologies). The test signal source ("source") of network analyzer 502 is connected to the RF generator side of absorptive filter network 302. The output of absorptive filter network 302 in response to the test signal is detected by a detector and plotted on a Smith chart.

Figure 5B:
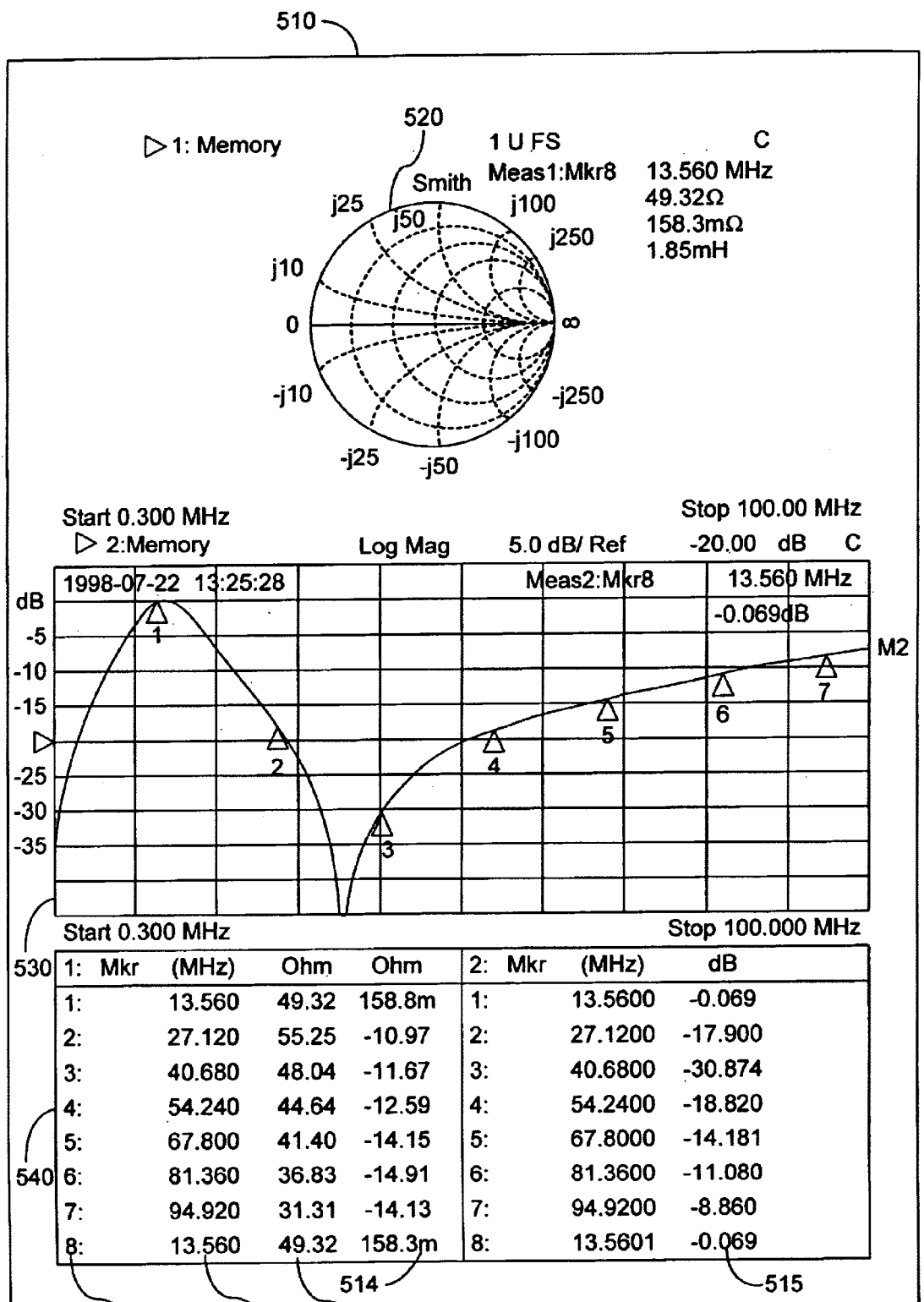
FIG. 5B shows an example test output from the test configuration of FIG. 5A.

FIG. 5B shows an example test output 510 generated by network analyzer 502 for test configuration 501. As shown in FIG. 5B, test output 510 includes a Smith chart 520, a plot 530 of attenuation versus frequency, and a table 540 of values corresponding to the markers on plot 530. In table 540, column 511 identifies the markers, column 512 shows the test signal frequency, column 513 shows the real part of the impedance seen by the source, column 514 shows the imaginary part of the impedance seen by the source, and column 515 shows the attenuation. For example, the first row of table 540 indicates that at the fundamental frequency of 13.56 MHZ the impedance seen by the source is 49.32+ j0.158 Ω. Further, the corresponding attenuation is only −0.069 dB, thus allowing energies at the fundamental frequency to pass with very little attenuation. Similarly, the third row (marker 3) of table 540 indicates that at 40.68 MHZ, which is the third harmonic, the impedance seen by the source is 48.04−j11.67 Ωwhile the corresponding attenuation is −30.874 dB. Examination of table 540 reveals that frequencies away from the fundamental frequency are attenuated, with the third harmonic having the most attenuation and the eight harmonic having the least attenuation. It can be appreciated that the importance of attenuating energies at specific harmonics vary by application, and can be addressed by appropriate selection of component values.

Referring to plot 530, a notch between the second (marker 2) and third (marker 3) harmonics is the result of setting the parallel resonant circuit of parallel-series resonant circuit 305 (see FIG. 3) to resonate at a frequency between the second and third harmonics. Setting the notch between the second and third harmonics increases the attenuation of other harmonic energies as well. The effect of the notch can be visualized as "pulling" the plotted line lower. Of course, the notch may be set at other frequencies away from the fundamental to suit specific applications.

Figure 5C:
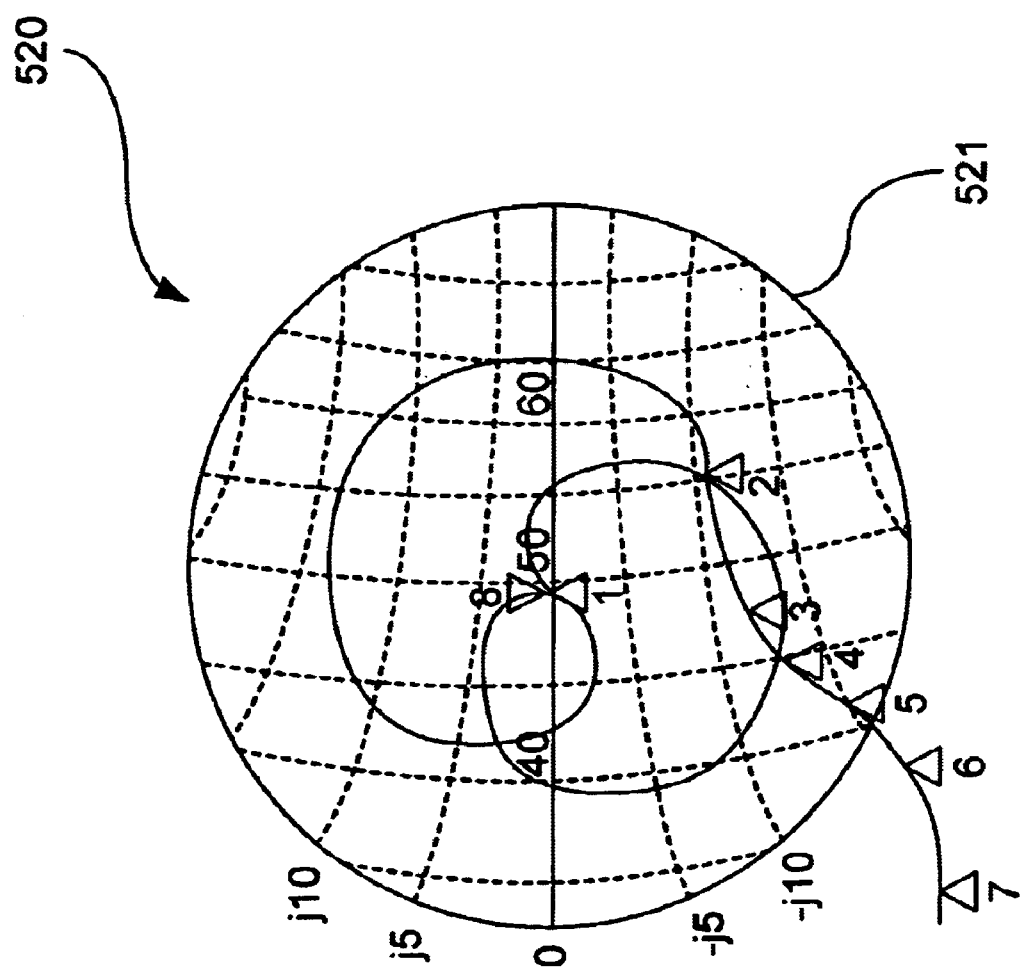
FIG. 5C shows a Smith chart from the example test output.

FIG. 5C shows a magnified view of the center portion of Smith chart 520. In FIG. 5C, circle 521 encompassing the Smith chart represents a 1.5:1 impedance mismatch as seen by the source. Ideally, all harmonics of the fundamental results in an impedance inside circle 521. For most semiconductor applications, however, getting the impedance within circle 521 at the fifth and lower harmonic frequencies is more than adequate.

As with other devices operating at RF frequencies, the electrical characteristics of absorptive filter network 302 are affected by enclosure and printed circuit board layout. Thus, absorptive filter network 302 is advantageously tested and tuned in its final packaged form using test configuration 501 (see FIG. 5A). For example, the physical dimensions of the inductors in absorptive filter network 302 can be adjusted to change inductance values such that electrical characteristics similar to that shown in test output 510 are obtained. For safety reasons, it is recommended that inductor adjustments are performed with the power OFF.

Absorptive filter networks 102 and 302 minimize RF power variations in single, fixed-frequency applications. For applications requiring variable-frequency RF power, a filter network 601 shown in FIG. 6 may be used. In filter network 601, a conventional low-pass filter 621 rejects energies at frequencies above a low-pass cut-off frequency ($f_{cLOW}$). For energies at frequencies below $f_{cLOW}$, low-pass filter 621 appears as a low impedance path between node 611 and node 612. For example, in an embodiment where the frequency of the RF power supplied to the plasma varies between 330 KHZ and 460 KHZ, $f_{cLOW}$ may be set to 500 KHZ, which is a frequency between the highest frequency (460 KHZ) and the second harmonic of the lowest frequency (660 KHZ; second harmonic of 330 KHZ). This allows energies at frequencies from 330 KHZ to 460 KHZ, the frequencies of interest, to pass through filter network 601 while rejecting energies at frequencies above 500 KHZ.

Figure 6:
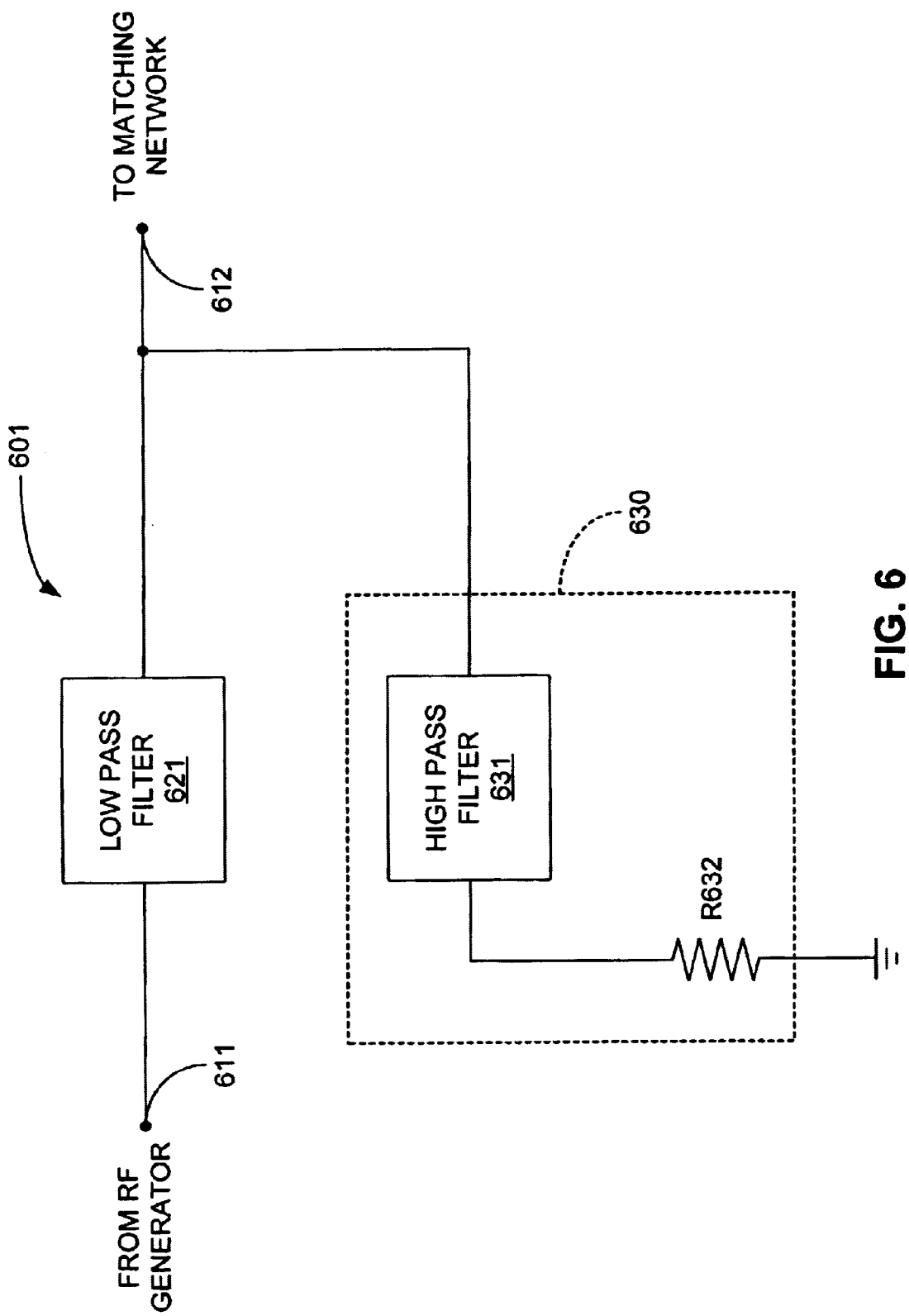
FIG. 6 shows a schematic diagram of a filter network for use in applications requiring variable frequency radio frequency power.

As shown in FIG. 6, a dissipating circuit 630 includes a conventional high pass filter 631. High pass filter 631 appears as a high impedance path for energies at frequencies below a high-pass cut-off frequency ($f_{cHIGH}$). This allows energies at the frequencies of interest, which are below $f_{cHIGH}$, to pass through filter network 601. For energies at frequencies above $f_{cHIGH}$, high pass filter 631 appears as a low impedance path between node 612 and resistor R632. These unwanted high frequency energies are dissipated by resistor R632 to prevent them from circulating in the semiconductor processing system. In the embodiment where the supplied RF power varies between 330 KHZ and 460 KHZ, setting $f_{cHIGH}$ to 500 KHZ results in the dissipation of energies at frequencies above 500 KHZ, while allowing energies at lower frequencies to pass.

As can be appreciated, although filter network 601 is specially suitable for variable frequency applications, it can also be used in single, fixed frequency applications. For example, in the embodiment where the RF generator generates RF power at a fixed frequency of 13.56 MHZ, $f_{cLOW}$ of low-pass filter 621 may be set between 13.56 MHZ and 27.12 MHZ (the second harmonic of 13.56 MHZ) to reject unwanted energies trying to pass through filter network 601. Correspondingly, the $f_{cHIGH}$ of high-pass filter 631 may be set to a frequency equal to $f_{cLOW}$ to dissipate unwanted energies coming from the plasma.

As is evident from the foregoing, filter network 601 helps prevent process shifts by allowing energies at the frequencies of interest to be delivered to the plasma while absorbing unwanted energies coming from the plasma.

A method and apparatus for stabilizing the (RF) power used in semiconductor device processing have been disclosed. While specific embodiments have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A semiconductor processing system having an RF generator, a matching network coupled to a reactor, and a filter network coupled between the RF generator and the matching network, wherein the filter network comprises:
   a first parallel resonant circuit coupled between a first end coupled to the RF generator and a second end coupled to the matching network;
   a capacitor coupled between the RF generator and the matching network, the capacitor forming a series resonant circuit with the first parallel resonant circuit;
   a second parallel resonant circuit coupled between the first end and a ground reference; and
   a first resistive element coupled between the first end and the ground reference so that radio frequency (RF) energies at frequencies away from a resonant frequency of the second parallel resonant circuit are dissipated in the first resistive element instead of being delivered to the reactor.

2. The system of claim 1, wherein the filter network further comprises:
   a third parallel resonant circuit coupled between the second end and the ground reference; and
   a second resistive element coupled between the second end and the ground reference so that harmonic energies coming from the plasma are dissipated in the second resistive element instead of being delivered to the RF generator.

3. The system of claim 1 wherein the reactor includes a chemical vapor deposition (CVD) reactor.

4. The system of claim 1 wherein the reactor includes a physical vapor deposition (PVD) reactor.

5. The system of claim 1 wherein the resistive element includes an attenuator.

6. The system of claim 1 wherein the resistive element includes a resistor.

7. A semiconductor processing system having an RF generator, a matching network coupled to a reactor, and a filter network coupled between the RF generator and the matching network, wherein the filter network comprises:
   a first parallel resonant circuit coupled between a first end coupled to the RF generator and a second end coupled to the matching network;
   a capacitor coupled between the RF generator and the matching network, the capacitor forming a series resonant circuit with the first parallel resonant circuit;
   a second parallel resonant circuit coupled between the second end and a ground reference; and
   a first resistive element coupled between the second end and the ground reference so that radio frequency (RF) energies at frequencies away from a resonant frequency of the second parallel resonant circuit are dissipated in the first resistive element instead of being delivered to the RF generator.

8. The system of claim 7, wherein the filter network further comprises:
   a third parallel resonant circuit coupled between the first end and the ground reference; and
   a second resistive element coupled between the first end and the ground reference so that harmonic energies coming from the RF generator are dissipated in the second resistive element instead of being delivered to the reactor.

9. The system of claim 7, wherein the reactor includes a chemical vapor deposition (CVD) reactor.

10. The system of claim 7, wherein the reactor includes a physical vapor deposition (PVD) reactor.

11. The system of claim 7, wherein the resistive element includes an attenuator.

12. The system of claim 7, wherein the resistive element includes a resistor.

* * * * *